(12) United States Patent
Sun et al.

(10) Patent No.: US 6,251,800 B1
(45) Date of Patent: Jun. 26, 2001

(54) ULTRATHIN DEPOSITED GATE DIELECTRIC FORMATION USING LOW-POWER, LOW-PRESSURE PECVD FOR IMPROVED SEMICONDUCTOR DEVICE PERFORMANCE

(75) Inventors: Sey-Ping Sun, Austin; Mark I. Gardner, Cedar Creek, both of TX (US); Charles E. May, Gresham, OR (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/227,513

(22) Filed: Jan. 6, 1999

(51) Int. Cl.[7] .......................... H01L 21/31; H01L 21/469
(52) U.S. Cl. .......................... 438/763; 438/541; 438/653
(58) Field of Search .................................. 438/541, 550, 438/558, 563, 763, 761, 627, 653

(56) References Cited

U.S. PATENT DOCUMENTS

| | | | |
|---|---|---|---|
| 5,970,350 | 10/1999 | Gardner et al. | 438/287 |
| 5,994,209 | * 11/1999 | Yich et al. | 438/541 |
| 6,100,163 | 8/2000 | Jang et al. | 438/437 |
| 6,137,176 | * 10/2000 | Morozumi et al. | 257/751 |

* cited by examiner

*Primary Examiner*—David Nelms
*Assistant Examiner*—Phuc T. Dang
(74) *Attorney, Agent, or Firm*—Kevin L. Daffer; Conley, Rose & Tayon P.C.

(57) ABSTRACT

An ultrathin gate dielectric and a method for forming the same are provided. The gate dielectric is believed to allow enhanced performance of semiconductor devices including transistors and dual-gate memory cells. A low-power, low-pressure plasma-enhanced chemical vapor deposition (PECVD) method employing silane and nitrous oxide sources is used to deposit the dielectric. As compared to conventional PECVD deposition, the method uses lower silane and nitrous oxide flow rates, a more dilute silane in nitrogen mixture, a lower chamber pressure, and a lower radio frequency power density. These settings allow plasma conditions to stabilize so that deposition may be performed in time increments at least as short as 0.1 second, so that oxide thicknesses at least as small as one angstrom may be controllably deposited. The oxide is preferably deposited in portions at multiple substrate mounting positions in a deposition chamber. Combination of oxide portions in this manner is believed to reduce the density of pinholes in the oxide, and the low-power, low-pressure deposition conditions are further believed to reduce plasma damage to the oxide and reduce the density of trap states in the oxide. A rapid thermal anneal of the oxide may be performed after deposition, and may improve the quality of the interface between the oxide and the underlying semiconductor substrate.

20 Claims, 4 Drawing Sheets

ULTRATHIN DEPOSITED GATE DIELECTRIC FORMATION USING LOW-POWER, LOW-PRESSURE PECVD FOR IMPROVED SEMICONDUCTOR DEVICE PERFORMANCE

BACKGROUND OF THE INVENTION

1. Field of the Invention

This invention relates to integrated circuit fabrication and, more particularly, to an ultrathin deposited gate dielectric formed using in-situ deposition and anneal processes.

2. Description of the Relevant Art

Fabrication of a metal-oxide-semiconductor (MOS) integrated circuit involves numerous processing steps. A gate dielectric, typically formed from silicon dioxide ("oxide"), is formed on a semiconductor substrate which is doped with either n-type or p-type impurities. For each MOS field effect transistor (MOSFET) being formed, a gate conductor is formed over the gate dielectric, and dopant impurities are introduced into the substrate to form a source and drain. A pervasive trend in modern integrated circuit manufacture is to produce transistors having feature sizes as small as possible. Many modern day processes employ features, such as gate conductors and interconnects, which have less than 1.0 μm critical dimension. As feature size decreases, the sizes of the resulting transistor and the interconnect between transistors also decrease. Fabrication of smaller transistors allows more transistors to be placed on a single monolithic substrate, thereby allowing relatively large circuit systems to be incorporated on a single, relatively small die area.

As MOSFET feature sizes decrease, gate oxide thickness decreases as well. This decrease in gate oxide thickness is driven in part by the demands of overall device scaling. As gate conductor widths decrease, for example, other device dimensions must also decrease in order to maintain proper device operation. Early MOSFET scaling techniques involved decreasing all dimensions and voltages by a constant scaling factor, to maintain constant electric fields in the device as the feature size decreased. This approach has given way to more flexible scaling guidelines which account for operating characteristics of short-channel devices. For example, a maximum value of MOSFET subthreshold current can be maintained while feature sizes shrink, by decreasing any or all of several quantities, including gate oxide thickness, operating voltage, depletion width, and junction depth, by appropriate amounts.

Another factor driving reduction of gate oxide thickness is the increased transistor drain current realized for a reduced gate dielectric thickness. Higher transistor drain currents are desirable because they allow each transistor to drive a greater number of other transistors, and can result in increased switching speeds. The transistor drain current is proportional to the amount of charge induced in the transistor channel region by the voltage applied to the gate conductor. The amount of charge induced by a given voltage drop across the gate oxide is the voltage drop multiplied by the capacitance of the oxide. Increasing the capacitance of the oxide therefore increases the transistor drain current. The capacitance C of the oxide can be written as for a parallel plate capacitor:

$$C = \epsilon A / t_{ox},$$

where $\epsilon$ is the permittivity of the oxide, A is its area, and $t_{ox}$ is the oxide thickness. It can be seen that reducing oxide thickness increases the oxide capacitance and thereby the drive current of a transistor.

A gate oxide is typically grown onto the upper surface of a silicon substrate by heating the substrate to a temperature greater than about 700° C. in an oxidizing ambient. Such thermal oxides have been traditionally preferred over deposited oxides because thermal oxides generally exhibit lower trap state densities within the oxide and at the silicon/oxide interface. Trap states are energy levels, typically associated with impurities or defects, that can trap electrons or holes at the location of the impurity or defect. "Hot" carriers, or carriers which attain high kinetic energy (typically from the electric field moving them along a transistor channel), are particularly susceptible to being injected into the oxide and captured by trap states there. If a sufficiently high density of trap states is associated with an oxide, charge may build up in the oxide as carriers become trapped. This can lead to shifts in the transistor threshold voltage with time.

Although thermal oxides are attractive because of the low trap densities associated with them, growth of very thin thermal oxides (less than about 100 angstroms thick) does present difficulties. For example, the growth rate of a thermal oxide is dependent on oxide thickness for a given set of growth conditions. In particular, the growth rate is more rapid during the initial stages of growth than it is after growth of approximately 300 angstroms of oxide. Initial-stage oxide growth can be modeled using a growth rate which decreases exponentially with increasing thickness. This strong variation of growth rate for low oxide thicknesses makes it difficult to grow controllable, reproducible oxides with thicknesses of less than about 50 angstroms. Another problem with growing very thin oxides is that roughness, contamination, and imperfections in the starting silicon surface become increasingly important to the integrity of the grown oxide. Any locally weak or excessively thin spots may become preferred sites for breakdown of the oxide when exposed to electric fields during device operation. Breakdown is a potential problem with very thin oxides, whether they are grown or deposited, and may be precipitated by physical defects such as pinholes or thin areas. Trap states within the oxide may also lead to breakdown, by trapping charge which causes locally elevated electric fields. Tunneling current through the oxide may be locally increased as a result of such an elevated field, leading to breakdown.

It would therefore be desirable to develop a method for controllable, reproducible formation of ultrathin (less than about 50 angstroms thick) gate oxides. The desired gate oxide should be breakdown-resistant and substantially free of trap states which may cause $V_T$ shifts.

SUMMARY OF THE INVENTION

The problems outlined above are in large part addressed by a low-power, low-pressure plasma-enhanced chemical vapor deposition (PECVD) process for oxide deposition, and the resulting ultrathin, reproducible gate oxide. The gate oxide may be used in semiconductor devices including, for example, transistors and dual-gate memory cells. Furthermore, this deposited gate oxide may be used alone or as part of a stacked oxide combining thermal and deposited portions. The oxide is grown by PECVD using silane and nitrous oxide ($N_2O$) sources and a lowered chamber pressure, as compared to conventional PECVD oxide depositions, of approximately 1.1 to 1.3 torr. A comparatively low radio frequency (RF) power density of less than about 0.15 W/cm² is also used. These low-power, low-pressure conditions allow for extremely rapid stabilization of plasma conditions, such that deposition may be performed in increments at least as short as 0.1 second. For each 0.1 second deposition increment, an oxide thickness of between about 1 angstrom and about 2 angstroms is deposited. In this manner, extremely thin oxides can be deposited controllably and reproducibly. In contrast to thermal growth of thin oxides, the deposition rate of the low-power, low-pressure PECVD oxide is substantially constant. The deposition temperature is preferably between about 390 and about 410° C.

In a preferred embodiment, the oxide is grown in a deposition chamber associated with a "cluster tool" such as those commonly used in the semiconductor industry. Cluster tools include chambers grouped together so that multiple deposition, etching, or other processes can be performed sequentially without exposing substrates to room air in the interim between processes. The CVD chambers often have multiple (for example, six) substrate mounting positions. A substrate is moved sequentially into different positions during a deposition such that a portion of the deposition takes place with the substrate in each of the mounting positions in the chamber. For example, a substrate may be loaded into the first substrate mounting position of the chamber, after which one-sixth of the deposition is performed. The substrate is then moved to the second substrate mounting position, while a second substrate is brought into the chamber and loaded into the first position. Another one-sixth of a deposition is performed, and the process continues with movement of the two substrates into adjacent positions and entry of a third substrate into the chamber. This type of system is designed to improve the uniformity of a deposited layer across the substrate by averaging out random process variations which are chamber-location dependent, in addition to increasing throughput by allowing overlapping deposition sequences for multiple substrates.

In an embodiment of the method recited herein for which such a chamber is used, the deposition time at each substrate mounting position may be a multiple of 0.1 second. For each 0.1-second increment at a mounting position, between about 1 and about 2 angstroms is deposited. The total oxide thickness is therefore in a range from about 6 angstroms to about 12 angstroms if 0.1-second depositions are performed using a chamber with six mounting positions. This combination of multiple depositions is believed to improve the uniformity of the oxide and to reduce pinhole density. It is postulated that any pinholes which may form during a deposition using one substrate mounting position are unlikely to be in the same location as any pinholes which may form during deposition on a different mounting position, so that the density of holes threading through the entire oxide layer is reduced. A uniform, pinhole-free oxide is believed to be resistant to dielectric breakdown during device operation.

The method recited herein differs from conventional silane-based PECVD oxide depositions in several ways. Conventional depositions typically use higher reactant gas flow rates, such as about 300 standard cubic centimeters per minute (sccm) for silane and about 9500 sccm for nitrous oxide. Flow rates for the low-power, low-pressure method recited herein are about 45–55 sccm of silane and about 5800–6200 sccm of nitrous oxide. Furthermore, the dilution of silane in an $N_2$ carrier gas is greater in the low-power, low-pressure method than for a conventional deposition. For example, the silane-to-nitrogen flow rate ratio for the low-power process is between about 0.015 and 0.025, while this ratio may be about 0.2 for a conventional process. A conventional deposition may use a chamber pressure of about 2.4 torr, and an RF power density of about 0.45 W/cm², while the low-power, low-pressure method uses a chamber pressure of about 1.1–1.3 torr and an RF power density of about 0.15 W/cm² or less.

In addition to allowing plasma conditions to equilibrate rapidly so that short deposition increments may be used, the low-power, low-pressure deposition conditions recited herein are believed to result in reduced plasma damage to the grown oxide. Plasma processes can damage device layers through mechanisms including bombardment by energetic ions and implantation of charged species. A reduction in plasma damage is believed to contribute to an oxide relatively free of physical defects and trap states. The extremely low oxide deposition rate resulting from the method recited herein may also enhance the quality of the grown oxide. The growth of $SiO_2$ from silane and $N_2O$ proceeds through the reaction:

$$SiH_4 + 2N_2O \rightarrow SiO_2 + 2N_2 + 2H_2.$$

It is postulated that a slow growth rate allows this chemical reaction to proceed completely, so that volatile reaction products are not "buried" in the $SiO_2$ film. In particular, incorporation of hydrogen into the oxide may be avoided. Hydrogen in dielectrics is believed to contribute to hot-electron effects in transistors by increasing the density of available trap states which can be occupied by hot electrons injected into a dielectric. Hydrogen diffuses rapidly in oxide, and so can diffuse to silicon/oxide interfaces near the transistor channel where it may disrupt the pre-existing bonds. Although dangling bonds may be terminated with silicon-hydrogen bond formation, silicon-hydrogen bonds are weak and can easily be broken by injected hot electrons. In this way, hydrogen may exacerbate hot-electron effects. A reduction in hydrogen incorporation into an oxide is therefore believed to reduce trap state densities and mitigate hot-electron effects. Electrical measurements on 100-angstrom-thick oxides grown by the method recited herein show the oxides to be resistant to hot carrier effects and substantially free of threshold voltage shifts.

Subsequent to the low-power, low-pressure PECVD oxide deposition described above, a rapid thermal annealing (RTA) process may be performed. Such an anneal may help to simulate conditions under which thermal oxide growth is performed, and may thereby lower trap state densities at the oxide/silicon interface. The RTA process is preferably performed in a nitrogen-bearing ambient at a temperature between about 850° C. and about 1000° C. for a time between about 30 seconds and about 120 seconds. Depending on the particular ambient used, some nitrogen may be incorporated into the oxide during this anneal. Such nitrogen incorporation may be advantageous, for example, by reducing the diffusivity of dopant impurity atoms in the oxide. The RTA process is preferably performed either in a chamber which is part of a cluster tool including the oxide deposition chamber, or possibly in the oxide deposition chamber. In this way, the oxide is not exposed to room air in the interim between the deposition and the anneal. This is desirable because room air exposure may cause particulate contamination and/or unwanted oxidation. After the formation and optional annealing of the gate oxide as described above, further device fabrication is typically performed. This fabrication generally includes formation of a gate conductor above the gate oxide. Such gate conductor fabrication is preferably performed within the same cluster tool as is used for the gate oxide formation, again so that contamination from room air exposure is avoided.

In addition to the method described above, a gate oxide is contemplated herein. The oxide thickness may be as small as about 3 angstroms (about one atomic layer thickness) and as thick as about 100 angstroms. Furthermore, the oxide is substantially free of pinholes and trap states that cause threshold voltage shifting. In one embodiment, the entire oxide is PECVD-deposited. In an alternate embodiment, a stacked oxide including a lower thermal oxide portion and an upper deposited oxide portion is contemplated. A stacked oxide may allow a low interface state density associated with thermal oxides to be combined with a uniform thickness and low pinhole density associated with deposited oxides.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed. On the contrary, the intention is to cover all modifications, equivalents, and alternatives falling within the spirit and scope of the present invention.

DETAILED DESCRIPTION OF THE PREFERRED EMBODIMENTS

Figure 1:
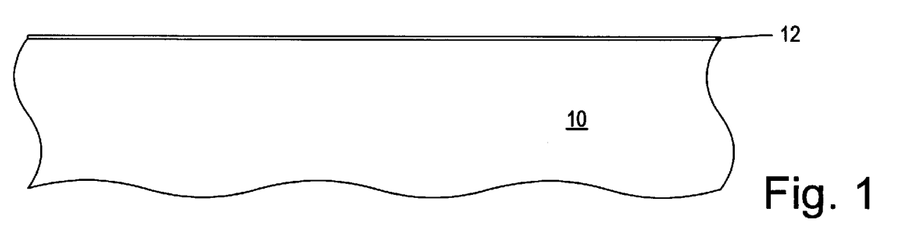
FIG. 1 is a partial cross-sectional view of a semiconductor topography including a semiconductor substrate and a first portion of a low-power, low-pressure PECVD oxide.

Turning to the drawings, FIG. 1 illustrates a partial cross-section of a semiconductor topography including an ultrathin oxide portion 12 formed upon semiconductor substrate 10. Semiconductor substrate 10 is preferably silicon, and is doped either n-type (for producing a p-channel transistor) or p-type (for an n-channel transistor). Substrate 10 may be an epitaxial silicon layer grown on a monocrystalline silicon substrate, or an n-type or p-type well region formed in a monocrystalline silicon substrate. Alternatively, substrate 10 may be an epitaxial silicon layer formed upon an insulating layer on a semiconductor substrate. The deposited gate dielectric recited herein may also be suitable for other semiconductors, such as, for example, gallium arsenide. Although not shown, there may be dielectric isolation regions formed within substrate 10 to prevent electrical interaction between subsequently-formed semiconductor devices. Methods of forming the isolation regions may include dielectric deposition to fill trenches etched into the substrate or local oxidation of silicon.

Oxide portion 12 is formed by low-power, low-pressure PECVD using silane and $N_2O$ sources at a deposition temperature between about 350° C. and about 450° C. In a preferred embodiment, the deposition temperature is 400° C. The silane is preferably diluted in nitrogen such that the ratio of silane flow rate to nitrogen flow rate is less than about 1/40. The high-frequency (about 13.56 MHz) RF power density used in the deposition is less than or equal to about 0.15 W/cm$^2$. These low-power, low-pressure conditions allow extremely short deposition times to be used. A time increment of 0.1 second results in deposition of between 1 angstrom and 2 angstroms of oxide. Even shorter increments, such as 0.05 second, may also be possible. Before formation of oxide 12, the upper surface of substrate 10 should be carefully cleaned. For example, a standard cleaning procedure employed for silicon substrates, known as the RCA method after the laboratory at which it was formulated, may be used before oxide 12 is formed. An RCA clean involves oxidation of a silicon substrate in solutions which combine either an acid or a base with hydrogen peroxide, and subsequent removal of the oxide using a hydrofluoric acid (HF) solution. A final HF dip may be performed before substrate 10 is loaded into a deposition chamber for formation of oxide portion 12.

In a preferred embodiment, oxide portion 12 is deposited with substrate 10 on one substrate mounting position of a deposition chamber having multiple substrate mounting positions. Examples of such a deposition chamber include the Concept I and Concept II model chambers manufactured by Novellus. These Novellus chambers are typically equipped with six substrate mounting positions. To deposit oxide portion 12 on a mounting position of a Novellus chamber, silane, typically diluted with nitrogen, and $N_2O$ may be flowed through a 9-inch diameter showerhead positioned above the substrate mounting position. Application of RF power of between about 300 W and 360 W to the showerhead initiates the deposition of oxide. Suitable gas flow rates for deposition in this chamber include between about 45 and about 55 sccm of silane, between about 5500 and about 6500 sccm of $N_2O$, and between about 2300 and about 2700 sccm of nitrogen. The chamber pressure for this embodiment is between about 1.1 and about 1.3 torr.

Figure 2:
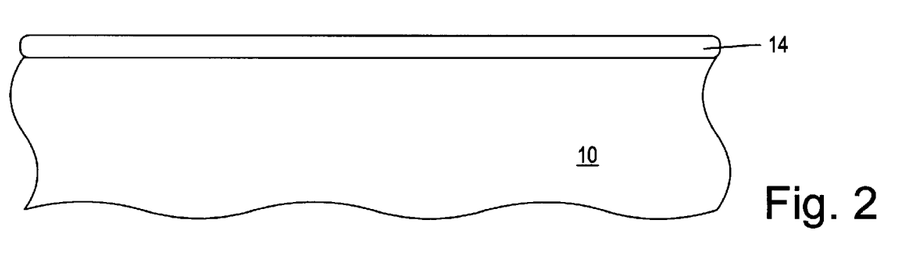
FIG. 2 is a partial cross-sectional view of the semiconductor topography, wherein subsequent low-power, low-pressure depositions have been performed to form a complete oxide, subsequent to the oxide portion formation of FIG. 1.

Deposition of an additional oxide portion with the substrate on each substrate mounting position of a multiple-mounting-position deposition chamber may be used to form complete oxide 14, shown in FIG. 2. In an embodiment for which a six-position chamber such as the Novellus Concept I or II is used, performing a 0.1-second deposition at each position results in a thickness between about 6 angstroms and about 12 angstroms for oxide 14. As noted above, oxide 14 is believed to be substantially free of pinholes which penetrate the entire oxide when grown using multiple substrate mounting positions. The low-power, low-pressure PECVD growth conditions used are further thought to reduce plasma damage to oxide 14. In addition, these growth conditions and the resulting low growth rate are believed to result in reduced trap densities in oxide 14.

Figure 3:
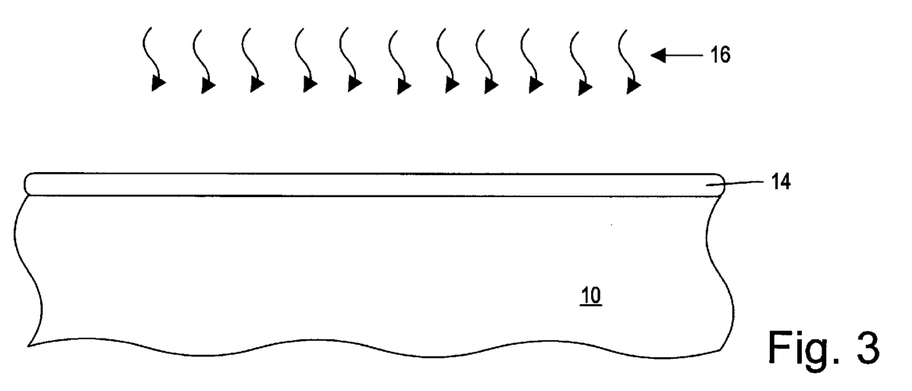
FIG. 3 is a partial cross-sectional view of the semiconductor topography wherein a rapid thermal anneal in a nitrogen-bearing ambient is performed, subsequent to the oxide formation of FIG. 2.

Thermal process 16 may subsequently be performed on substrate 10 and oxide 14, as shown in FIG. 3. Thermal process 16 involves heating substrate 10 in a nitrogen-bearing ambient to an anneal temperature greater than about 800° C. for a time less than about 5 minutes. In a preferred embodiment, the anneal temperature is between 850° C. and 1000° C., and the anneal time is between 30 seconds and 2 minutes. Thermal process 16 is preferably performed using an RTA apparatus which allows rapid heating and cooling of the substrate (heat and cool times of a few seconds or less). RTA equipment typically includes lamps which provide radiant heating of the substrate and a low-thermal-mass substrate holder. In a preferred embodiment, thermal process 16 is performed in such a way that oxide 14 is not exposed to room air. This may be achieved, for example, by carrying out thermal process 16 in an additional chamber which is linked to the oxide deposition chamber as part of a cluster tool. Nitrogen-bearing ambients which may be used for thermal process 16 include $N_2$ and $NH_3$, among other nitrogen-containing gases. If a more reactive gas such as $NH_3$ is used, some nitrogen may be incorporated into oxide 14 during thermal process 16. As noted above, this may be advantageous by increasing the resistance of oxide 14 to impurity diffusion. Application of thermal process 16 to oxide 14 may improve the interface between oxide 14 and substrate 10 by, for example, reducing the density of interface trap states.

Figure 4:
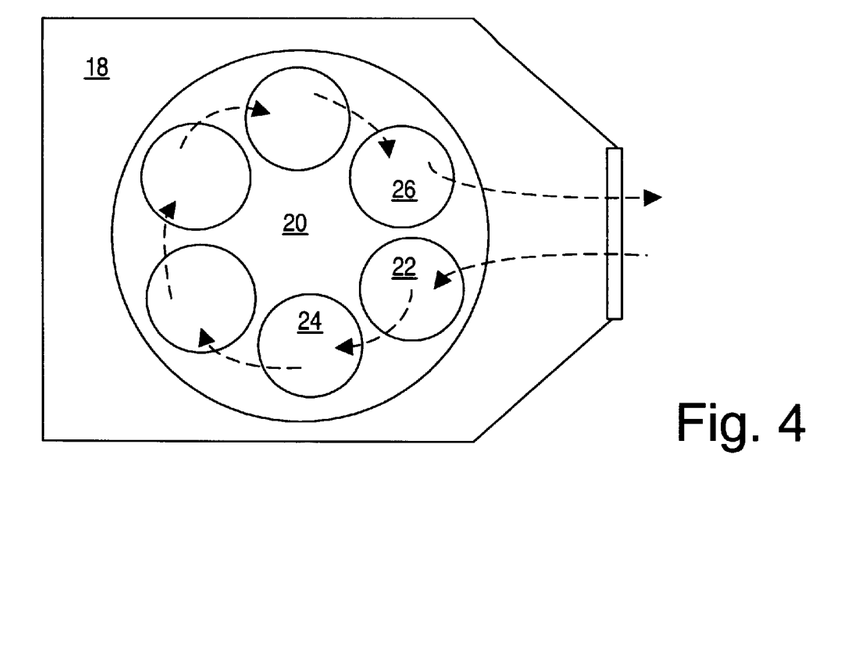
FIG. 4 is a top plan view showing the substrate mounting position layout of an exemplary deposition system.

Turning now to FIG. 4, a cross-sectional top view of an exemplary deposition chamber 18 is shown. The layout of the chamber shown in FIG. 4 is similar to that of, for example, a Novellus Concept I or Concept II chamber. Substrate mounting surface 20 includes multiple substrate, or wafer, mounting positions (in this case, six). The dashed-line arrows show the path taken by a substrate entering the chamber for a deposition. A first portion of a deposited layer is formed with the substrate on first mounting position 22. The substrate is then moved to second mounting position 24 for deposition of a second portion of the layer. The deposition process typically continues on each mounting position until the sixth portion is deposited with the substrate on sixth mounting position 26, and the substrate is then moved out of the deposition chamber. Although the sequence in moving through chamber 18 has been described for one substrate, it should be noted that during typical operation of the deposition system illustrated in FIG. 4, a new substrate is moved onto first mounting position 22 and a completed substrate is removed from the chamber after each portion of a deposition. In other words, six substrates may be undergoing deposition simultaneously, each substrate within one portion of the chamber receiving a portion of the total deposition amount. Parts of a typical chamber which are not shown in FIG. 4 include a substrate-handling mechanism, substrate heaters, plumbing for delivery of reactant gases, electrodes for plasma generation, and one or more vacuum pumps. Although six substrate mounting positions are shown in the chamber of FIG. 4, a different number of positions could be used.

Figure 5:
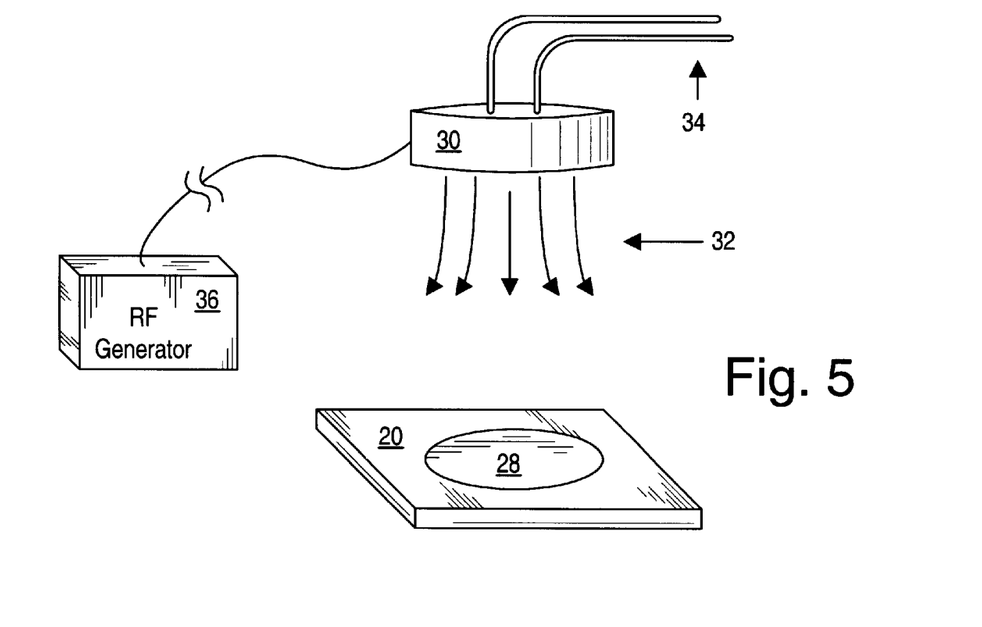
FIG. 5 is a perspective view showing the gas delivery and RF connection layout at a substrate mounting position of an exemplary deposition system.

Turning now to FIG. 5, a cross-sectional view is shown which illustrates the gas delivery and RF connection layout at a substrate mounting position of a deposition chamber such as chamber 18 in FIG. 4. Substrate 28 is mounted in a substrate mounting position of mounting surface 20, a portion of which is shown in FIG. 5. Showerhead 30 is positioned above substrate 28, such that reactant gases 32 may be delivered to the vicinity of substrate 28. Gas lines 34 deliver reactant gases to showerhead 30 for dispersal, typically through an array of holes. A high-frequency RF voltage is typically connected to a metal portion of showerhead 30, using RF generator 36 which is external to the chamber wall. The RF voltage is typically connected through an electrical matching network. In the event that a low-frequency RF voltage is used, it is typically connected to metal substrate mounting surface 20. In embodiments of the method recited herein which use a chamber such as the Novellus Concept 2, low-frequency power is not necessary for the low-power, low-pressure PECVD oxide deposition recited herein.

Figure 6:
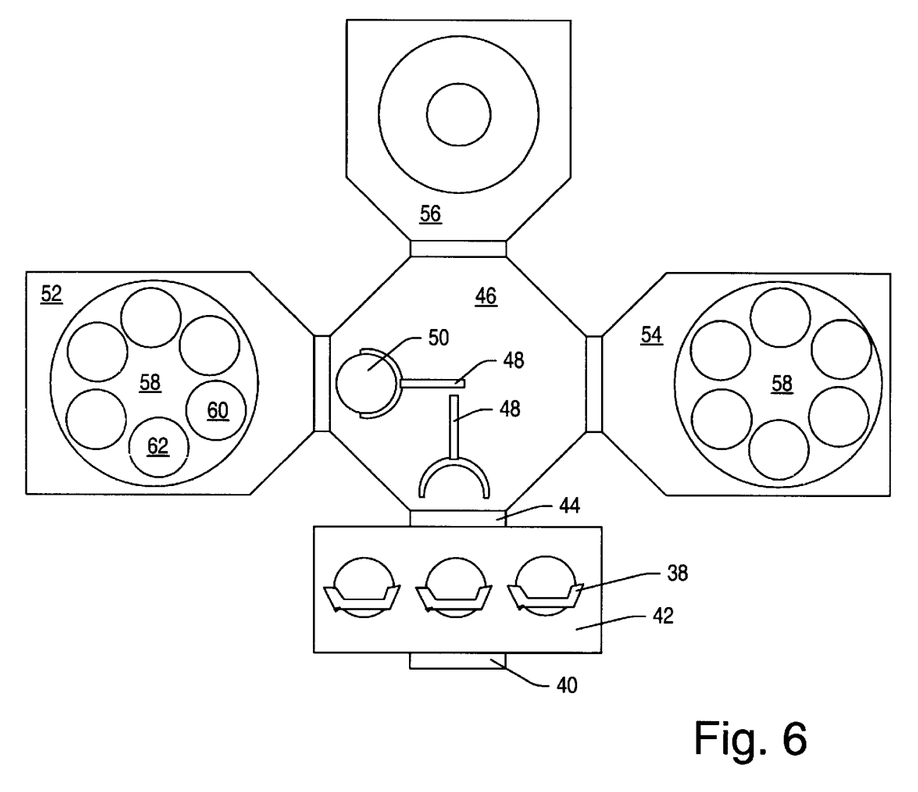
FIG. 6 is a cross-sectional top view showing the layout of an exemplary cluster tool including two deposition chambers and a heating chamber which are mutually connected and separate from an outside ambient.

A cross-sectional top view showing an exemplary cluster tool arrangement with which the method of FIGS. 1–3 might be carried out is shown in FIG. 6. A group of substrates is stacked in wafer cassette 38. Cassette 38 may be loaded through valve 40 into loadlock/entry chamber 42 of the cluster tool. Valve 44 connects loadlock chamber 42 to transfer chamber 46. Transfer chamber 46 contains one or more substrate manipulators 48 which can remove a substrate from cassette 38 and transfer it to a substrate mounting position in an attached chamber. Although shown here as forks which fit under and/or around a substrate such as substrate 50, a substrate manipulator 48 could take other forms. For example, a vacuum wand which uses a vacuum to grip a substrate might be used. Substrate manipulators 48 are configured for movement in various ways so that substrates may be moved in and out of the attached chambers. Forms of movement employed might include rotation, translation along a track, and telescoping to become longer or shorter. Chambers attached to transfer chamber 46 in the embodiment of FIG. 6 include deposition chambers 52 and 54, similar to chamber 18 shown in FIG. 4, and heating chamber 56. Deposition chambers 52 and 54 are each equipped with six substrate mounting positions, while heating chamber 56 has one mounting position.

Cluster tools such as that shown in FIG. 6 provide substantial flexibility in process sequences and conditions which may achieved without exposing a substrate to the ambient outside the cluster tool. For example, a showerhead for introduction of reactant gases, such as showerhead 30 in FIG. 5, is typically positioned above each of the substrate mounting positions in deposition chambers 52 and 54. RF voltages may be applied to the showerhead and/or to substrate mounting surface 58 as may be needed for plasma deposition or etching processes. Parameters such as gas composition and flow rate and RF power configuration may typically be controlled independently for each substrate mounting position. The deposition and annealing processes which may be used to form the gate dielectric recited herein may therefore all be performed using a cluster tool such as that of FIG. 6. This may be accomplished by moving substrate 10 into and out of the associated chambers, or possibly by performing all of the processes in a single chamber.

Figure 7:
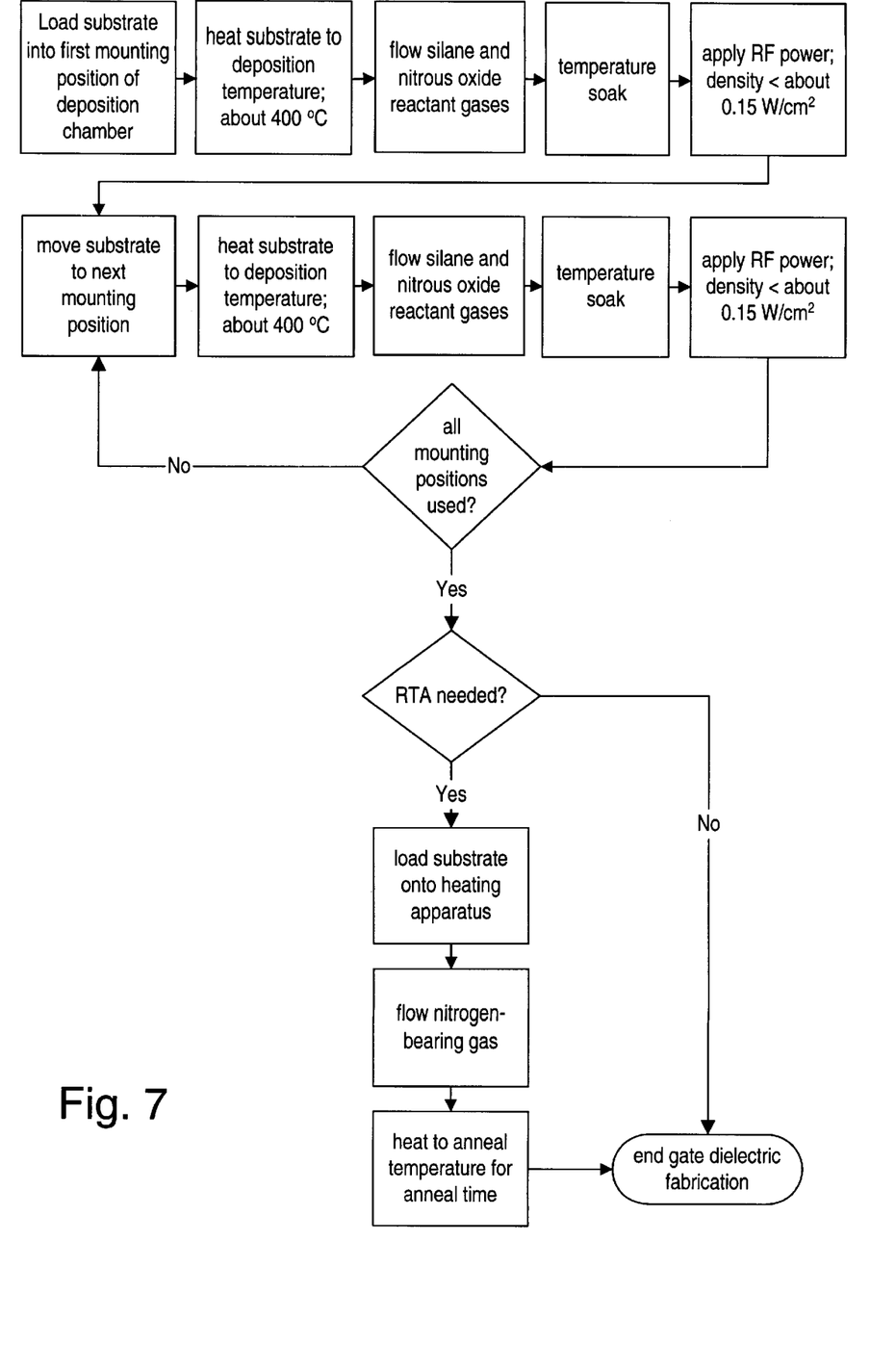
FIG. 7 is a flow diagram of the process sequence for an embodiment of the method recited herein.

A procedure for performing the method recited herein using equipment such as that shown in FIGS. 4–6 is given by the flow diagram of FIG. 7. The procedure of the flow diagram is described here, using reference labels for parts of the equipment shown in FIGS. 4–6. To perform the process recited herein for ultrathin gate oxide formation on a substrate such as substrate 50 of FIG. 6, substrate 50 may be loaded onto first substrate mounting position 60 of deposition chamber 52. As described in the flow diagram of FIG. 7, the substrate is heated to deposition temperature and silane and $N_2O$, corresponding to reactant gases 32 in FIG. 5, are flowed above the substrate, preferably through a showerhead such as showerhead 30. The silane is preferably diluted in nitrogen such that the ratio of silane to nitrogen flow rates is less than about 1/40. As noted above, in an embodiment for which a Novellus Concept I or II chamber is used, suitable reactant gas flow rates are between about 45 and about 55 sccm of silane, between about 5500 and about 6500 sccm of $N_2O$, and between about 2300 and about 2700 sccm of nitrogen.

A "temperature soak", or a time delay to allow substrate temperature and other process conditions to stabilize, is then performed. This temperature soak time is preferably between about 30 seconds and about 1 minute. By contrast, a conventional PECVD deposition process typically uses a temperature soak time of about 10 seconds. The low-pressure, low-silane-flow conditions used in the method recited herein appear to require a longer stabilization time. If a Novellus chamber is used, the chamber pressure is between about 1.0 and 1.5 torr at the end of the temperature soak. Following the temperature soak, RF power is applied to the deposition chamber such that an RF power density of less than 0.15 W/cm$^2$ is established over the substrate. The RF power is preferably applied to a showerhead such as showerhead 30. With the application of this RF power, deposition of an oxide layer such as oxide portion 12 of FIG. 1 occurs.

Substrate 50 may then be moved to second substrate mounting position 62 of chamber 52 for deposition of a second oxide portion. The heating, gas flowing, temperature soak, and RF power application described above are then repeated, as shown in the flowchart of FIG. 7, and the process continues until an oxide portion is deposited at each of the substrate mounting positions. A complete oxide such as oxide 14 shown in FIG. 2 results from this process. This oxide may be subsequently annealed, as shown in the flow diagram of FIG. 7. This anneal is preferably performed in an attached chamber such as heating chamber 56, though it may be possible to perform it in oxide deposition chamber 52. In embodiments for which a Novellus Concept I or II or similar deposition chamber is used for oxide deposition, it is generally not convenient to use the deposition chamber for the anneal. Because a single heater is used in this chamber to heat all substrate mounting positions simultaneously, it is impossible to perform a deposition on one substrate at one temperature at the same time an anneal is performed on another substrate at a different temperature. The different time increments used for the oxide portion depositions and the anneals recited herein also preclude simultaneous deposition and annealing. The throughput advantages of processing multiple substrates simultaneously on multiple substrate mounting positions would therefore be lost.

Subsequent to gate dielectric formation as shown in the flowchart of FIG. 7, device fabrication may be continued on the substrate. Typical devices which may be fabricated using the gate oxide recited herein include transistors and memory cells. Device fabrication generally continues with fabrication of a gate conductor over the newly-formed gate dielectric. As noted above, such a gate conductor is preferably using a deposition chamber associated with a cluster tool in which the gate dielectric is formed. In this way, contamination at the interface between the gate dielectric and gate conductor is avoided.

It will be appreciated to those skilled in the art having the benefit of this disclosure that this invention is believed to provide a method for forming a high-quality, ultrathin deposited gate dielectric. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A method for forming a gate oxide for a semiconductor device, comprising:
   heating a semiconductor substrate to a temperature between about 350° C. and 450° C. in a deposition chamber;
   flowing silane and nitrous oxide above the semiconductor substrate, such that a pressure in the deposition chamber is less than about 2 torr; and
   applying RF power to the deposition chamber such that a low-power plasma is formed, wherein an RF power density applied is less than about 0.15 W/cm$^2$.

2. The method as recited in claim 1, wherein said heating the semiconductor substrate comprises using a deposition chamber comprising multiple substrate mounting positions.

3. The method as recited in claim 1, wherein said flowing comprises directing the silane and nitrous oxide through a showerhead positioned above the semiconductor substrate.

4. The method as recited in claim 1, wherein said flowing comprises using a nitrous oxide flow rate between about 5500 sccm and about 6500 sccm.

5. The method as recited in claim 1, wherein said flowing comprises using a silane flow rate between about 45 sccm and about 55 sccm.

6. The method as recited in claim 1, wherein said applying RF power further comprises using a frequency of about 13.56 MHz.

7. The method as recited in claim 1, wherein said applying RF power further comprises applying the RF power for a time increment of about 0.5 seconds or less.

8. The method as recited in claim 1, wherein said using a silane flow rate further comprises using a dilute mixture of silane in nitrogen, such that a ratio of silane to nitrogen flow rates is less than about 0.025.

9. The method as recited in claim 1, wherein said flowing further comprises establishing a chamber pressure between about 1.0 torr and 1.5 torr.

10. The method as recited in claim 1, wherein said flowing further comprises flowing a nitrogen carrier gas having a nitrogen flow rate between about 2300 sccm and 2700 sccm.

11. The method as recited in claim 1, further comprising maintaining the semiconductor substrate in a nitrogen-bearing ambient at an anneal temperature greater than about 800° C. for an anneal time less than about 5 minutes, subsequent to said applying RF power.

12. The method as recited in claim 11, wherein said maintaining further comprises using an ambient comprising nitrogen.

13. The method as recited in claim 11, wherein said maintaining further comprises using an ambient comprising ammonia.

14. A method for forming a gate oxide for a semiconductor device, comprising:
   loading a semiconductor substrate into a first substrate mounting position of a deposition chamber having multiple substrate mounting positions;
   heating the semiconductor substrate to a deposition temperature in a range from about 350° C. to about 450° C.;
   flowing silane and nitrous oxide into the deposition chamber through a showerhead positioned above the semiconductor substrate;
   waiting a duration of a temperature soak time of less than about 60 seconds;
   applying RF power to the showerhead subsequent to said waiting, such that a portion of an oxide layer is deposited upon the semiconductor substrate, wherein the RF power has a density of less than about 0.15 W/cm$^2$; and
   sequentially moving the semiconductor substrate to each of remaining mounting positions in the deposition chamber for deposition of another portion of the oxide layer at each substrate mounting position, such that a complete oxide layer is deposited, wherein said deposition of another portion comprises said heating, said flowing, said waiting, and said applying RF power.

15. The method as recited in claim 14, wherein said flowing further comprises using a silane flow rate between about 45 sccm and 55 sccm and a nitrous oxide flow rate between about 5500 sccm and about 6500 sccm.

16. The method as recited in claim 14, wherein said flowing further comprises using a dilute mixture of silane in nitrogen, such that a ratio of silane to nitrogen flow rates is less than about 0.025.

17. The method as recited in claim 14, wherein said applying RF power further comprises applying the RF power for a time increment of 0.5 seconds or less.

18. The method as recited in claim 14, further comprising maintaining the semiconductor substrate in a nitrogen-bearing ambient at an anneal temperature greater than about 800° C. for an anneal time of between about 30 seconds and about 120 seconds, subsequent to said sequentially moving.

19. The method as recited in claim 18, wherein said sequentially moving the semiconductor substrate and said maintaining are performed within one or more chambers of a cluster tool.

20. The method as recited in claim 14, wherein said waiting further comprises using a temperature soak time of between about 30 seconds and about 60 seconds.

\* \* \* \* \*